(12) United States Patent
McLean et al.

(10) Patent No.: US 8,632,959 B2
(45) Date of Patent: *Jan. 21, 2014

(54) FLEXOGRAPHIC PRINTING PLATE ASSEMBLY

(75) Inventors: Michael E. McLean, Etowah, NC (US); William Krebs Goss, Arden, NC (US)

(73) Assignee: Day International, Inc., Plymouth, MI (US)

( * ) Notice: Subject to any disclaimer, the term of this patent is extended or adjusted under 35 U.S.C. 154(b) by 18 days.

This patent is subject to a terminal disclaimer.

(21) Appl. No.: 13/557,251

(22) Filed: Jul. 25, 2012

(65) Prior Publication Data

US 2012/0288801 A1 Nov. 15, 2012

Related U.S. Application Data

(63) Continuation of application No. 11/684,669, filed on Mar. 12, 2007, now Pat. No. 8,252,514.

(60) Provisional application No. 60/781,979, filed on Mar. 14, 2006.

(51) Int. Cl.
*G03F 7/26* (2006.01)

(52) U.S. Cl.
USPC ............. 430/306; 430/270.1; 430/273.1

(58) Field of Classification Search
USPC ................................... 430/306
See application file for complete search history.

(56) References Cited

U.S. PATENT DOCUMENTS

| | | | |
|---|---|---|---|
| 3,903,794 A | 9/1975 | Grupe et al. | |
| 4,582,777 A | 4/1986 | Fischer et al. | |
| 4,869,997 A | 9/1989 | Koch et al. | |
| 5,370,968 A * | 12/1994 | Goss et al. | 430/271.1 |
| 5,798,019 A | 8/1998 | Cushner et al. | |
| 5,860,360 A | 1/1999 | Lane, III et al. | |
| 5,861,201 A | 1/1999 | Blackwelder et al. | |
| 5,888,697 A | 3/1999 | Fan | |
| 5,916,403 A | 6/1999 | Cushner et al. | |
| 5,976,765 A * | 11/1999 | Kumpfmiller et al. | 430/306 |
| 6,125,753 A * | 10/2000 | Praet et al. | 101/375 |
| 6,182,568 B1 | 2/2001 | Ogita et al. | |
| 6,247,403 B1 | 6/2001 | Randazzo | |
| 6,425,327 B1 | 7/2002 | Fan et al. | |
| 6,696,221 B1 | 2/2004 | McLean et al. | |
| 6,699,548 B2 | 3/2004 | Van Weperen et al. | |

(Continued)

FOREIGN PATENT DOCUMENTS

| | | |
|---|---|---|
| EP | 0 057 593 A2 | 8/1982 |
| EP | 0 177 302 A2 | 4/1986 |

(Continued)

OTHER PUBLICATIONS

Horst, R.S. et al.; Resist Process; IBM Technical Disclosure Bulletin, Jun. 1972; p. 46; vol. 15, No. 1.

*Primary Examiner* — Cynthia H Kelly
*Assistant Examiner* — Chanceity Robinson
(74) *Attorney, Agent, or Firm* — Dinsmore & Shohl LLP

(57) ABSTRACT

A printing plate assembly for use in flexographic printing application is provided which includes an integral carrier layer, one or more cushion layers, and one or more photopolymer layers. The photopolymer layer(s) in the integral assembly are provided with relief images using digital imaging photopolymerization, which eliminates the need for a back exposure step and provides a precise relief depth for the plate.

10 Claims, 2 Drawing Sheets

(56) References Cited

U.S. PATENT DOCUMENTS

| | | |
|---|---|---|
| 6,703,095 B2 | 3/2004 | Busshoff et al. |
| 6,855,482 B2 | 2/2005 | McLean et al. |
| 6,966,259 B2 | 11/2005 | Kanga et al. |
| 6,976,426 B2 | 12/2005 | McLean et al. |
| 2002/0069777 A1 | 6/2002 | Rossini et al. |
| 2003/0054153 A1 | 3/2003 | Kuczynski et al. |
| 2003/0129384 A1 | 7/2003 | Kalchbrenner |
| 2003/0136285 A1 | 7/2003 | Telser et al. |
| 2003/0157285 A1 | 8/2003 | Busshoff et al. |
| 2004/0067438 A1 | 4/2004 | Fan et al. |
| 2004/0187719 A1 | 9/2004 | Knoll et al. |
| 2005/0034618 A1 | 2/2005 | Barre et al. |
| 2005/0150406 A1 | 7/2005 | Kanga et al. |
| 2005/0170287 A1 | 8/2005 | Kanga |
| 2005/0247222 A1 | 11/2005 | McLean et al. |
| 2005/0250043 A1 | 11/2005 | McLean et al. |
| 2005/0277062 A1 * | 12/2005 | McLean et al. ............... 430/311 |

FOREIGN PATENT DOCUMENTS

| | | |
|---|---|---|
| EP | 0 766 142 A1 | 4/1997 |
| EP | 0 766 143 | 4/1997 |
| EP | 1 107 063 | 6/2001 |
| EP | 1 154 322 A1 | 11/2001 |
| EP | 1 239 329 | 9/2002 |
| EP | 1 422 567 A2 | 5/2004 |
| GB | 2 140 575 A | 11/1984 |
| JP | 58160956 | 9/1983 |
| WO | 98/53370 | 11/1998 |
| WO | 98/53370 A1 | 11/1998 |
| WO | WO 98/53370 * | 11/1998 |
| WO | 99/36270 | 7/1999 |
| WO | 01/49510 | 7/2001 |
| WO | 2005070690 A1 | 8/2005 |
| WO | 2005110043 A2 | 11/2005 |
| WO | 2005110751 A1 | 11/2005 |
| WO | 2005111725 A1 | 11/2005 |

* cited by examiner

FLEXOGRAPHIC PRINTING PLATE ASSEMBLY

CROSS REFERENCE TO RELATED APPLICATIONS

This application is a continuation of U.S. patent application Ser. No. 11/684,669, filed Mar. 12, 2007, which claims the benefit of U.S. Provisional Application No. 60/781,979 filed Mar. 14, 2006. The entire contents of said applications are hereby incorporated by reference.

BACKGROUND OF THE INVENTION

The present invention relates to a printing plate assembly for use in flexographic printing applications, and more particularly, to an improved printing plate assembly including an integral carrier layer, cushion layer, and a photopolymer layer, which assembly provides a precise relief depth. The assembly is easily mounted on a flexographic cylinder and printed by an end user.

Flexographic printing is a form of relief printing which utilizes relief printing plates wrapped around a printing cylinder to transfer ink onto a substrate. Flexographic printing is primarily used in high-volume printing applications in the packaging and newspaper industries, and is typically used for printing substrates such as paper, plastic, foil, and corrugated board.

In recent years, flexographic printing has involved the use of printing plates formed from photopolymerizable compositions. Such photopolymerizable compositions typically comprise at least an elastomeric binder, a monomer, and a photoinitiator. Upon exposure of the photopolymer plate from the back to actinic radiation, polymerization of the photopolymerizable layer occurs. This step is typically referred to as a "back exposure" step in which the polymerized portion of the cross-section of the printing plate is formed, which is referred to as the "floor." After the desired image of the printing plate is formed, typically by exposing the photopolymer layer from the front by actinic radiation, the unexposed areas of the plate are removed to form a relief image.

In addition to the printing plate, a separate carrier or attachment layer is typically used in conjunction with the printing plate which aids in attachment of the printing plate to the printing cylinder. The carrier layer is typically formed from a plastic material and includes tabs or strips at each end which are used to fix the printing plate to the printing cylinder after it is wrapped around the cylinder. Further, it is often desirable to include a separate cushion layer below the printing plate to provide an even impression across and around the cylinder. Such a cushion layer may comprise a foam layer or a foam tape which can be adhered to the printing plate.

Typically, the carrier layer and cushion layer are produced separately, and are adhered to each other and the printing plate using adhesive tapes. The three components are assembled together in registration by an end user after the printing plate is exposed to create the desired relief image, and are then mounted on the flexographic press cylinder. However, such an assembly process is time consuming and subject to stacking tolerance problems due to tolerance variations in each individual layer in the assembly. It would be desirable to be able to simplify the assembly process.

Accordingly, there is still a need in the art for an improved method of assembling a photopolymer printing plate, cushion layer, and carrier attachment for use in flexographic printing operations.

SUMMARY OF THE INVENTION

Embodiments of the present invention meet that need by providing a printing plate assembly which includes an integral carrier layer, one or more cushion layers, and one or more photopolymer layers for attachment to a cylinder in a flexographic printing press. Because the carrier layer, cushion layer(s), and photopolymer layer(s) are provided to the user as one integral unit, no assembly of those components is required prior to mounting on a flexographic press, there are no variations in stacking tolerance, and all images produced will remain in registration with each other.

In addition, the photopolymer layer is provided with relief images using digital imaging photopolymerization, which eliminates the need for a back exposure step to establish a floor and provides a precise relief depth for the plate.

According to one aspect of the present invention, a printing plate assembly for use in flexographic printing is provided which comprises a carrier layer having first and second major surfaces; at least one cushion layer on at least one of the first and second major surfaces of the carrier layer; and at least one imagable photopolymer layer over the carrier layer. By the term "on," it is meant that the layers are in direct contact with each other. By the term "over," it is meant that the layer is above, but not necessarily in contact with the other layer.

The carrier layer, cushion layer, and photopolymer layer(s) form an integral printing plate assembly. In one embodiment of the invention, the cushion layer is on the first surface of the carrier layer and the photopolymer layer is on the second surface of the carrier layer. In another embodiment of the invention, the cushion layer is on the second surface of the carrier layer and the photopolymer layer is on the cushion layer.

In yet another embodiment of the invention, the printing plate assembly comprises first and second cushion layers and a first photopolymer layer; where the first cushion layer is on the first surface of the carrier layer; the second cushion layer is on the second surface of the carrier layer, and the first photopolymer layer is on the second cushion layer.

In all of the above embodiments, the printing plate assembly may include a second photopolymer layer on the first photopolymer layer.

Preferably, the carrier layer is non-extensible. By "non-extensible," it is meant that the dimensions of the carrier material will remain substantially unchanged when subjected to the tension, compression, and sheer forces typically encountered during the lifetime of the material in printing operations. Thus, the carrier layer will maintain its original mounted length during printing operations such that it requires minimal or no retensioning. The carrier layer is preferably comprised of vinyl, polyester film, or metal.

The cushion layer is preferably selected from the group consisting of an open cell foam, a closed cell foam, or a soft, volume displaceable material. The cushion layer preferably has a thickness of between about 0.25 mm and 3.25 mm, and more preferably, between about 1.0 mm and 1.5 mm.

The photopolymer layer(s) may be comprised of liquid, semi-solid (i.e., gel or paste), or solid photopolymers. Where the photopolymer comprises a liquid photopolymer, the photopolymer is preferably selected from acrylates, exoxies, urethanes, and unsaturated polyesters. Where the photopolymer layer comprises a solid photopolymer, the photopolymer is preferably selected from a styrenic block copolymer-based material, a urethane-based material, or a rubber-based material. The photopolymer layer preferably has a thickness of between about 1.0 and about 1.5 mm.

Embodiments of the present invention also provide methods of making a printing plate assembly for use in flexographic printing which, in one embodiment, comprises providing a cushion layer; applying a carrier layer on the cushion layer; applying at least one photopolymer layer on the carrier layer to form an integral printing plate assembly; exposing portions of the photopolymer layer to a source of radiation to cure the photopolymer and form a relief image; and removing unexposed portions of the photopolymer layer. Preferably, the radiation source is a digital light imaging system. The method eliminates the need for a back exposure step to establish a floor.

The method may optionally include applying a tie coating to the carrier layer prior to applying the photopolymer layer.

In an alternative embodiment, the method comprises providing a first cushion layer; applying a carrier layer on the first cushion layer; applying a second cushion layer on the carrier layer; applying a first photopolymer layer on the second cushion layer to form an integral printing plate assembly; and exposing portions of the first photopolymer layer to radiation to form a relief image.

Optionally, a tie coating may be applied to the carrier layer prior to applying the first photopolymer layer.

In yet another embodiment, the method comprises providing a carrier layer; applying a cushion layer on the carrier layer; applying a photopolymer layer on the cushion layer to form an integral printing assembly; and exposing portions of the photopolymer layer to a source of radiation to form a relief image; and removing unexposed portions of the photopolymer layer.

The above embodiments in the method of making the printing plate assembly may further include applying a second photopolymer layer on the first photopolymer layer.

With the assembly and digital imaging method of the present invention, the dimensions of each of the cushion layer(s), carrier layer, and photopolymer layer(s) are precisely controlled, which allows the relief depth of the desired image on the plate to be optimized for the desired end use. Further, the integral assembly eliminates the need for a "back exposure" step because the unit functions as a replacement for the "floor" formed by the back exposure step used in prior art methods. That is, the raised image formed by a single front exposure step of the final product performs like a raised image on a traditional photopolymer floor formed from a back exposed method. The relief depth (i.e., the distance between the upper surface of the raised image in the photopolymer layer and the integrated carrier/cushion layer construction) which is achieved with the printing plate assembly of the present invention can be varied, as desired, from about 0.50 mm to about 2.00 mm by controlling the thickness of the applied photopolymer layer.

The resulting printing plate assembly containing the imaged photopolymer layer(s) (image transfer element), cushion layer(s) and carrier layer may be mounted on a flexographic printing cylinder and used for printing as is conventional in the art.

Once the particular printing job for which the image was produced has been completed, the printing plate assembly may be demounted and, if desired, the raised image may be removed so that the printing plate assembly can receive a new raised image.

Accordingly, it is a feature of the present invention to provide a printing plate assembly for use in flexographic printing applications which includes an integral carrier layer, cushion layer, and photopolymer layer, which assembly may be provided with a precise relief depth without the need for a floor. Other features and advantages of the invention will be apparent from the following description, the accompanying drawings, and the appended claims.

DETAILED DESCRIPTION OF THE PREFERRED EMBODIMENTS

The practice of embodiments of the present invention provides several advantages over prior art methods and products which utilize a separate printing plate, cushion layer, and carrier layer, all of which must be assembled prior to use. By supplying a printing plate assembly including integral carrier, cushion, and photopolymer layers, an end user does not have to assemble the separate components prior to use, resulting in lower labor costs. In addition, the relief image depth may be more precisely controlled because the integral unit does not require a prior art back-exposure step, which has resulted in variations in floor thickness. Rather, the integral assembly and method of the present invention provides the formation of a relief image depth in the photopolymer layer of the integrated assembly in one step. The dimensions and layer thicknesses of the carrier, cushion and photopolymers can be precisely controlled and result in a final product which is ready for printing.

In addition, the use of the integral assembly provides higher print quality and predictability, and improved tolerances and image registration. It should be appreciated that accurate registration is achieved when using different integrated assemblies, for example, for the purpose of printing different colored images. This consistent registration results in reduced set-up time on the printing press.

Figure 1:
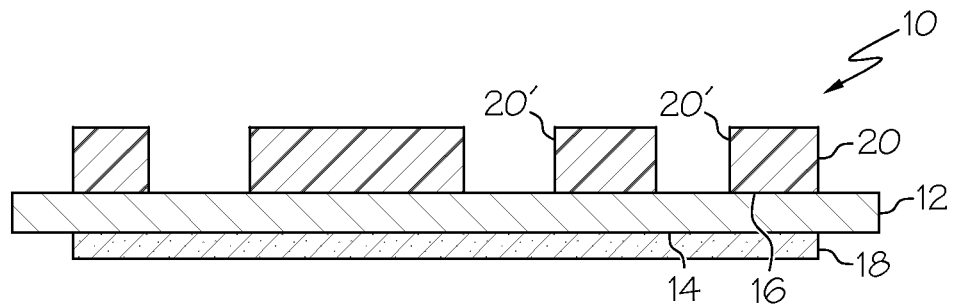
FIG. 1 is a cross-sectional view of a printing plate assembly according to an embodiment of the present invention.

FIG. 1 illustrates one embodiment of the printing plate assembly 10 including a carrier layer 12 having first and second major surfaces 14 and 16, a cushion layer 18 on the first surface 14 of the carrier layer, and a photopolymer layer 20 on the second surface 16 of the carrier layer. As shown, the photopolymer layer 20 has been crosslinked to form a relief image 20'.

The cushion layer 18 is preferably an elastomeric material selected from the group consisting of open cell foams, closed cell foams, or a soft, volume displaceable material. The cushion layer preferably has a thickness of between about 0.25 and 3.25 mm, and more preferably, between about 1.0 and 1.5 mm. Where the cushion layer forms the base layer of the assembly, it may be provided in the form of a sheet.

In the embodiment shown in FIG. 1, the carrier layer 12 is applied over the cushion layer 18. Preferably, the carrier layer and the cushion layer are provided as a single unit. An example of such a product is GREYBACK™, commercially available from Day International, Inc.

The carrier layer 12 preferably comprises vinyl, polyester film, or metal, but may comprise any suitable non-extensible material. The carrier layer preferably includes an attachment mechanism comprising tabs or strips at each end (not shown) which enable the assembly to be fixed to a flexographic printing cylinder. The carrier layer preferably has a thickness of between about 0.25 mm and 2.0 mm.

A continuous photopolymer layer 20 is applied over the carrier layer 12 to form an integral assembly. Where the photopolymer layer is provided in solid form, the layer preferably comprises a styrenic block copolymer based material such as Dupont Cyrel® TDR or DRC or MacDermid TPC and BAC. The solid photopolymer layer is preferably provided in the form of a sheet which may be laminated to the underlying cushion or carrier layer with the use of heat and pressure and/or with an adhesive.

Where the photopolymer layer is provided in liquid form, the photopolymer may comprise acrylates, epoxies, urethanes, and unsaturated polyesters. The photopolymer layer preferably has a thickness of from between about 1.0 and 1.50 mm and such thickness may be precisely controlled to provide the requisite relief image depth.

It should also be appreciated that the photopolymer may also be provided in a semi-solid form, such as a gel or paste. Where the photopolymer is in liquid or gel form, the photopolymer may be dispensed into a chamber directly on the carrier layer, or it could be preformed into a desired shape if supplied in the form of a gel.

An optional tie layer (not shown) may be applied prior to application of the photopolymer layer to enhance adhesion of the layer to the underlying cushion or carrier layer. The tie layer may be provided as a photopolymer-receptive coating and may comprise materials such as polyvinylidene chloride, acrylics, acrylates, epoxies, and hot melt adhesives. The tie layer may also be designed to allow removal of the photopolymer layer(s) at a later time so that the printing plate carrier assembly can be recovered and re-used.

Figure 2:
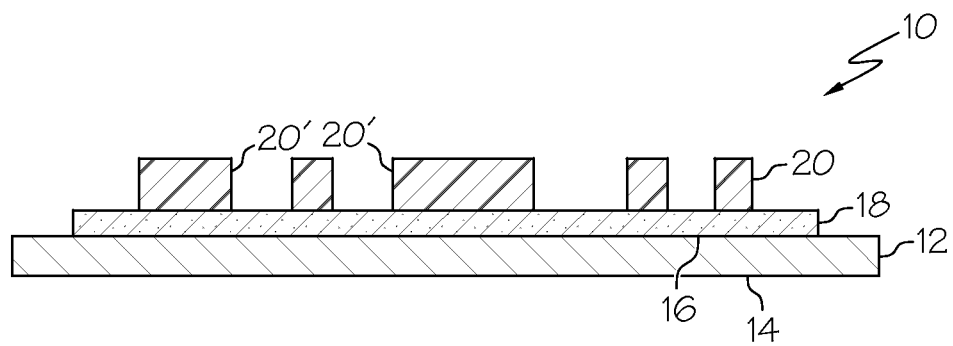
FIG. 2 is a cross-sectional view of a printing plate assembly according to another embodiment of the present invention.

Referring now to FIG. 2, another embodiment of the invention is illustrated in which the printing plate assembly comprises a carrier layer 12 including first and second major surfaces 14 and 16, a cushion layer 18 on the second surface 16 of the carrier layer, and a photopolymer layer 20 over the cushion layer that has been imaged to form a relief image 20'. In this embodiment, the cushion layer is preferably applied to the carrier layer by knife coating, slot die coating, curtain coating, spraying, or reverse roll coating. Alternatively, the cushion layer may be provided in the form of a sheet and applied to the carrier layer by lamination with an adhesive or by the application of heat and pressure. Alternatively, the cushion layer may be extrusion-laminated to the carrier layer.

Figure 3:
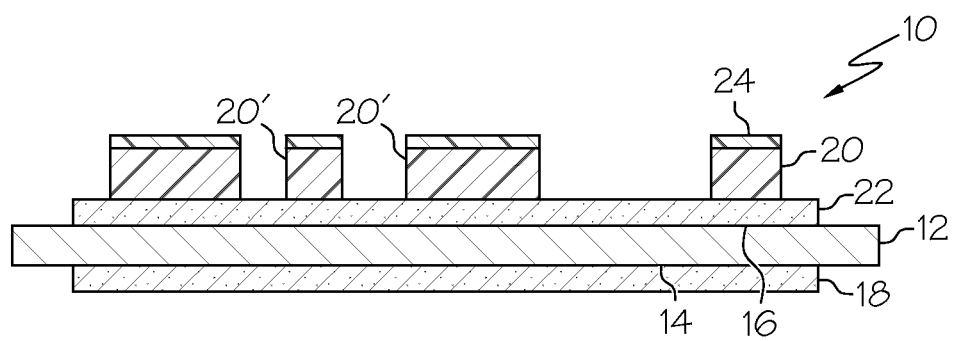
FIG. 3 is a cross-sectional view of a printing plate assembly according to another embodiment of the present invention.

FIG. 3 illustrates yet another embodiment of the invention in which two cushion layers and two photopolymer layers are included in the assembly. A first cushion layer 18 is provided as a base layer, the carrier layer 12 is positioned on the first cushion layer, a second cushion layer 22 is provided on the second surface 16 of carrier layer 12, and first and second photopolymer layers 20 and 24 are provided on the second cushion layer. Where the assembly includes two cushion layers, it should be appreciated that the layers may comprise different materials. For example, the first cushion layer may comprise an open-cell foam and the second cushion layer may comprise a closed-cell foam. The cushion layers are preferably selected so that the overall print performance is optimized for the particular type of graphic images that are desired. It will be appreciated that the use of one or both cushion layers and the materials comprising those layers will vary depending on the desired print quality/graphic.

In embodiments where two photopolymers layers are used, it should be appreciated that the first and second photopolymer layers may also comprise different materials. For example, the first photopolymer layer 20 may comprise a liquid photopolymer and the second photopolymer layer 24 may comprise a solid photopolymer. The second photopolymer layer is preferably a thin photopolymer layer which functions as a "cap" for the first photopolymer layer. The second photopolymer layer may be included, for example, to provide a different property from the first photopolymer such as a different hardness, or it may be dyed in color to provide a means of monitoring image/surface quality.

The first and second photopolymer layers are preferably irradiated simultaneously to obtain the desired relief image.

It should be appreciated that the number of layers and the order of the layers in the printing plate assembly may vary as long as the desired printing characteristics are achieved. For example, the assembly may include only the carrier layer and the photopolymer layer(s).

After application of the photopolymer layer(s), the printing plate assembly is preferably imaged using digital imaging photopolymerization as will be explained in greater detail below. The digital imaging system includes a light source which irradiates the photopolymer for a time sufficient to cure the photopolymer to form the relief image. The system further includes a mirror-type spatial light modulator which reflects light in an image pattern onto the surface of the photopolymer to photopolymerize selected portions of the photopolymer such that after removal of the unexposed polymer, relief areas are formed. The unexposed polymer may be removed by a number of methods, depending on whether the polymer is in liquid, solid, or semi-solid form. Preferred methods include mechanical removal such as with the use of a hot air knife, solvent processing, or thermal processing. The methods may be performed alone or in combination.

Figure 4:
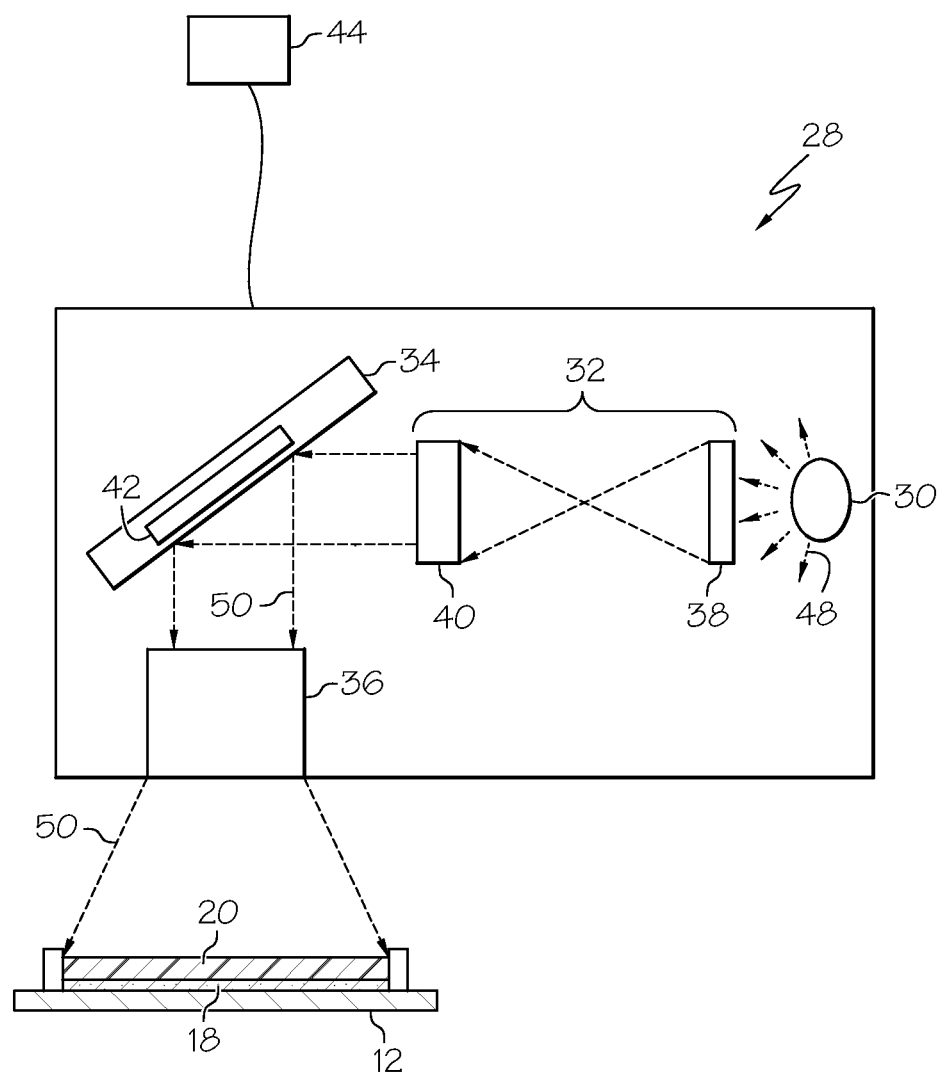
FIG. 4 is a schematic diagram of a digital imaging device used to produce a relief image on the printing plate assembly.

Referring now to FIG. 4, a digital light imaging system 28 used in accordance with the present invention is shown. In the embodiment shown, the relief image 20' (FIG. 1) of the photopolymer layer 20 is formed from a liquid photopolymer using the imaging system 28. The liquid photopolymer layer is preferably a photocurable or photopolymerizable material that is sensitive to radiation commonly in the visible and ultraviolet regions of the electronic spectrum (i.e., from about 250 to about 770 nm). Preferably, the photopolymer layer is exposed to radiation having a wavelength of at least 350 nm, and more preferably, at least 365 nm.

Also as shown in FIG. 4, the imaging system 28 includes a light source 30, a condenser 32, a digital light processor 34, and projection optics 36. The light source 30 provides actinic radiation to cure or polymerize the photopolymer layer 20. Preferably, the light source 30 is a visible light source, such as a metal halide lamp. The metal halide lamp should be unfiltered and have enough wattage to suitably crosslink the photopolymer with both visible and ultraviolet light. Lamps of higher light intensity may also be used to increase the rate of polymerization.

The condenser 32 focuses the divergent spectral radiation of the light source 30 into parallel rays such that a sufficient concentration of actinic radiation is available to form the relief image 20' with the imaging system 28. The condenser 32 receives light from the light source and provides collimated light to the digital light processor 34. Preferably, the condenser 32 comprises a convex lens 38 at one end and an adjustable slit 40 at the other, the slit being in the focal plane of the lens. Alternatively, the condenser 32 may be a single mirror. The condenser 32 may also comprise a plurality of lenses or a plurality of lenses in combination with at least one mirror or a plurality of mirrors in combination with at least one lens.

The digital light processor 34 selectively modulates the received collimated light into a desired image pattern and directs the desired image pattern to the projection optics 36.

The projection optics 36 focuses and positions the image output onto the photopolymer layer 20 to form the relief image 20'. The projection optics are preferably formed by a so-called Dyson imaging system comprising a filled lens, aperture lens, and a spherical imaging mirror. In one embodiment, the input and output numerical aperture is 0.167. The magnification is 1 to 1. In a preferred embodiment, the object and the image size is 10.2×13.6 mm.

The digital light processor 34 converts digital content into a digital bit stream that can be read by an included mirror-type spatial light modulator 42. Preferably, the digital content is composed on a microprocessor 44 that is in communication with the digital light processor 34 for image generation by the imaging system 28. However, other sources of digital content, such as memory chips, analog-to-digital decoders, video processors, and digital signal processors, may also be processed by the digital light processor 34.

Generally, the mirror-type spatial light modulator 42 is an individually addressable matrix of modulating micromirrors that builds digital images based on the provided digital bit stream. Mirror-type spatial light modulators include devices which tilt each micromirror by mechanical deformation of a fine piezoelectric element, and the like. One suitable spatial light modulator 42 is the Digital Micromirror Device (DMD) developed by Texas Instruments. The DMD semiconductor is basically an optical switch or a reflective spatial light modulator that consists of a matrix of about one million digitally-controlled microscopic mirrors.

Each digitally-controlled microscopic mirror is mounted on a hinge structure to allow each mirror to tilt at an angle from a horizontal plane between two states, +theta degrees for "on" or −theta degrees for "off." For the DMD semiconductor, the mirror tilt angle is ±10 degrees from the plane of the silicon substrate. As data "1" of the bit stream is written to a memory cell of the light modulator 42, the associated micromirror tilts by +theta degrees which directs a pixel of light from the light source 30 onto the photopolymer layer 20 via the projection optics 36. As data "0" of the bit stream is written to a memory cell of the light modulator, the associated micromirror tilts by −theta degrees, which directs the light away from the projection optics 36.

Each microscopic mirror can be electrically switched "on" and "off" up to approximately 50,000 times per second in accordance with the provided digital bit stream. As such, the wavelength or grey scale of incident light from the light source 30 is controlled by the duration of time that a micromirror is in the "on" state. By controlling the wavelength or grey scale of the light source 30, for each pixel, the desired image 50 is formed from the actinic radiation 48 of the light source 30 and projected onto photopolymer layer 20. By this method, the relief image 20' may be formed relatively quickly as practically all of the incident light from the light source 30 is reflected toward the photopolymer layer 20.

Additionally, because the light modulator 42 has a plurality of micromirrors arranged in a matrix, a full frame image of information on photopolymer layer 20 is photo-curable at one time. Furthermore, because each micromirror has a size of about 16 μm by 16 μm and the micromirrors are spaced less than 17 μm from each other, this close spacing of the micromirrors results in images that are projected as seamless, with higher resolution and little apparent pixellation. Moreover, as each micromirror is rectangularly shaped, each reflected incident of light creates a rectangular pixel with extremely sharp edges in the photopolymer layer 20. This is unlike the circular or rounded pixels created by laser imaging used in prior methods.

Accordingly, the light processor 34 reflecting actinic radiation in a precise pattern and with the proper amount of intensity from the light source 30, through the projection unit 36, and onto the photopolymer layer 20 provides crosslinking of the layer 20 and formation of relief image 20' in one step. Furthermore, it should be appreciated that such an arrangement permits longer exposure times with grey scale modulation than scanning systems which must crosslink the photopolymer linearly across a moving surface of the photopolymer. Moreover, each light modulating element of the light processor 34 has the advantage of a consistent spot size, shape, and location which permits the formation of sharp images with well-defined boundaries. An available DMD semiconductor from Texas Instruments permits imaging resolutions up to 1024 pixels×768 pixels. However, the full-frame imaging approach of the present invention can also be easily applied to any projection device that may result in higher resolutions and improved print quality.

The resulting printing plate assembly provides a ready-to-print product with an integral carrier layer, cushion layer and image transfer element that can be used with conventional flexographic printing equipment.

While the invention has been described herein with regard to digital imaging technology, it should be appreciated that it is also possible to image the printing plate assembly using well known techniques in the art including film/negative exposure, laser engraving or laser ablation, and injection molding.

It should also be appreciated that in the embodiment where the printing plate assembly uses solid photopolymers, it is possible to back expose the photopolymer layer prior to integration in the assembly to provide a true "floor" if desired.

Having described the invention in detail and by reference to preferred embodiments thereof, it will be apparent that modifications and variations are possible without departing from the scope of the invention.

What is claimed is:

1. A method of making a printing plate assembly for use in flexographic printing comprising:
   providing a cushion layer;
   applying a non-extensible carrier layer on said cushion layer in direct contact therewith;
   applying at least one photopolymer layer on said carrier layer to form an integral printing plate assembly; and
   exposing portions of said at least one photopolymer layer to a source of radiation to cure said photopolymer and form a relief image; and
   removing unexposed portions of said photopolymer layer.

2. The method of claim 1 wherein said radiation source is a digital light imaging system.

3. The method of claim 1 including applying a tie coating to said carrier layer prior to applying said photopolymer layer.

4. The method of claim 1 wherein said photopolymer layer comprises a liquid photopolymer.

5. The method of claim 1 wherein said photopolymer layer comprises a solid photopolymer.

6. The method of claim 1 wherein said photopolymer layer comprises a semi-solid photopolymer.

7. The method of claim 1 including exposing said photopolymer layer to radiation at a wavelength of about 365 nm.

8. The method of claim 1 wherein said photopolymer layer has a thickness of between about 1.0 and about 1.5 mm.

9. The method of claim 1 including applying a second photopolymer layer over said at least one photopolymer layer.

10. A method of making a printing plate assembly for use in flexographic printing comprising:
    providing a non-extensible carrier layer;

applying a cushion layer on said carrier layer;
applying a continuous photopolymer layer on said cushion layer to form an integral printing assembly; and
exposing portions of the surface of said photopolymer layer to a source of radiation to form a relief image; and
removing unexposed portions of said photopolymer layer.

* * * * *